（12）United States Patent
Jee et al.

(10) Patent No.: US 12,389,721 B2
(45) Date of Patent: Aug. 12, 2025

(54) LUMINESCENT NANOSTRUCTURE, PRODUCTION METHOD THEREOF, AND LIGHT EMITTING DEVICE INCLUDING THE SAME

(71) Applicant: SAMSUNG ELECTRONICS CO., LTD., Suwon-si (KR)

(72) Inventors: Sang Soo Jee, Hwaseong-si (KR); Shang Hyeun Park, Yongin-si (KR); Shin Ae Jun, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 713 days.

(21) Appl. No.: 17/677,064

(22) Filed: Feb. 22, 2022

(65) Prior Publication Data

US 2022/0278256 A1   Sep. 1, 2022

(30) Foreign Application Priority Data

Feb. 23, 2021   (KR) .................. 10-2021-0024429

(51) Int. Cl.
| H01L 33/44 | (2010.01) |
| C09K 11/02 | (2006.01) |
| H01L 33/00 | (2010.01) |
| H10H 20/01 | (2025.01) |
| H10H 20/84 | (2025.01) |

(Continued)

(52) U.S. Cl.
CPC ........... *H10H 20/84* (2025.01); *C09K 11/025* (2013.01); *H10H 20/01335* (2025.01); *B82Y 20/00* (2013.01); *B82Y 40/00* (2013.01); *H10H 20/034* (2025.01); *H10H 20/812* (2025.01); *H10H 20/825* (2025.01)

(58) Field of Classification Search
CPC ...................... H10H 20/01335–0137
See application file for complete search history.

(56) References Cited

U.S. PATENT DOCUMENTS

| 8,163,633 B2 | 4/2012 | Korgel et al. |
| 8,455,284 B2 | 6/2013 | Seong et al. |

(Continued)

FOREIGN PATENT DOCUMENTS

| CN | 111446325 A | 7/2020 |
| KR | 20110110669 A | 10/2011 |

(Continued)

OTHER PUBLICATIONS

Covalent Surface Modification of Oxide Surf, Angew. Chem. Int. Ed. 2014, 53, 6322-6356.

(Continued)

*Primary Examiner* — Alexandre F Ferre
(74) *Attorney, Agent, or Firm* — CANTOR COLBURN LLP

(57) ABSTRACT

A luminescent nanostructure, a production method for making the luminescent nanostructure, and an electronic device including the luminescent nanostructure. The luminescent nanostructure includes a semiconductor nanocrystal including a Group 13 metal nitride. The luminescent nanostructure has an aspect ratio of greater than or equal to about 1, and an organic compound having an M-O moiety, wherein M is Ti, Al, Zr, Sn, or Si that is bound to at least a portion of the surface of the luminescent nanostructure.

20 Claims, 3 Drawing Sheets

(51) Int. Cl.
  *B82Y 20/00* (2011.01)
  *B82Y 40/00* (2011.01)
  *H10H 20/812* (2025.01)
  *H10H 20/825* (2025.01)

(56) References Cited

U.S. PATENT DOCUMENTS

| | | |
|---|---|---|
| 8,920,685 B2 | 12/2014 | Jang et al. |
| 9,553,234 B2 | 1/2017 | Cha et al. |
| 10,988,598 B2 | 4/2021 | Bai et al. |
| 2012/0068153 A1* | 3/2012 | Seong ............... H10H 20/825 438/47 |
| 2013/0252363 A1 | 9/2013 | Seong et al. |
| 2016/0096927 A1* | 4/2016 | Jee .................. C09J 179/08 524/600 |
| 2018/0112069 A1* | 4/2018 | Bai ................... H10H 20/854 |
| 2018/0239247 A1* | 8/2018 | Kwon ................ G03F 7/027 |

FOREIGN PATENT DOCUMENTS

| | | |
|---|---|---|
| KR | 20120028103 A | 3/2012 |
| KR | 1660364 B1 | 9/2016 |
| KR | 20170133370 A | 12/2017 |

OTHER PUBLICATIONS

English Translation of Office Action dated Jul. 13, 2023 of the corresponding Korean Patent Application No. 10-2021-0024429, 10 pp.

Office Action dated Jul. 13, 2023 of the corresponding Korean Patent Application No. 10-2021-0024429, 9 pp.

* cited by examiner

LUMINESCENT NANOSTRUCTURE, PRODUCTION METHOD THEREOF, AND LIGHT EMITTING DEVICE INCLUDING THE SAME

CROSS-REFERENCE TO RELATED APPLICATION

This application claims priority to Korean Patent Application No. 10-2021-0024429 filed in the Korean Intellectual Property Office on Feb. 23, 2021, and all the benefits accruing therefrom under 35 U.S.C. § 119, the content of which in its entirety is incorporated herein by reference.

BACKGROUND

1. Field

A luminescent nanostructure, a production method for making the luminescent nanostructure, and a light emitting device including the luminescent nanostructure.

2. Description of the Related Art

Research and development on a small light emitting device that includes a semiconductor nanocrystal structure is of great and recent interest. For example, such a small light emitting device may be applied as a light source in various display devices. Therefore, it is desirable to develop a luminescent nanostructure applicable to such a small light emitting device.

SUMMARY

An embodiment provides, for example, a metal nitride-based luminescent nanostructure disposed on a wafer, and in particular, a relatively robust luminescent nanostructure capable of exhibiting a desired electrical/magnetic property where the nanostructure can maintain one or more of its intrinsic properties following subsequent process steps of production.

An embodiment provides a method of producing the aforementioned luminescent nanostructure.

An embodiment provides a light emitting device including the aforementioned luminescent nanostructure.

An embodiment provides a display device including the aforementioned luminescent nanostructure or light emitting device.

In an embodiment, the luminescent nanostructure includes a semiconductor nanocrystal (e.g., a conductive semiconductor nanocrystal, hereinafter, at times, referred to as a semiconductor nanocrystal) including a Group 13 metal nitride,
the luminescent nanostructure has an aspect ratio of greater than or equal to about 1, and
an organic compound having an M-O moiety (wherein M is Ti, Al, Zr, Sn, or Si) that is bound to a surface (e.g., at least a portion of the surface) of the luminescent nanostructure.

The luminescent nanostructure may not contain or not include cadmium.

The Group 13 metal nitride may include a gallium nitride, an indium nitride, an indium gallium nitride, an aluminum nitride, an aluminum gallium nitride, an indium aluminum gallium nitride, or a combination thereof.

The semiconductor nanocrystals may include a doped semiconductor nanocrystal (e.g., doped with an impurity).

The doped semiconductor nanocrystal may include a p-type doped first semiconductor material, an n-type doped second semiconductor material, or a combination thereof.

The luminescent nanostructure may include a p-type doped first semiconductor material, a n-type doped second semiconductor material, and an active layer disposed between the first semiconductor material and the second semiconductor material.

The active layer may include a material including a quantum well structure.

The luminescent nanostructure may further include an insulating layer on an outer surface of the luminescent nanostructure.

The insulating layer may include a metal oxide.

The metal oxide may include an aluminum oxide, a silicon oxide, or a combination thereof.

The luminescent nanostructure may have a longitudinally extended shape.

A diameter of the luminescent nanostructure may be greater than or equal to about 50 nanometers (nm), or greater than or equal to about 100 nm. The diameter may be a diameter of a cross-section perpendicular to the length of the luminescent nanostructure. The diameter may be a longest length extending across a center of the cross-section.

The luminescent nanostructure may have a diameter of less than or equal to about 1000 nm or less than or equal to about 800 nm.

The luminescent nanostructure may have an aspect ratio of greater than or equal to about 3, or greater than or equal to about 5.

The organic compound may include one or more repeating units *-L-O—*, wherein L is a substituted or unsubstituted $C_{1-10}$ or $C_{2-10}$ alkylene, and * is a portion linked or connected to an adjacent atom in the organic compound. The organic compound may include one or more alkylene oxide moiety.

The organic compound may include an organosilicon compound containing a Si—O—Si linkage.

The organic compound may include a carboxylate moiety, a phosphite moiety, a sulfonate moiety, an amine moiety, a carboxylic acid, an alkylene glycol moiety (e.g., an ethylene glycol moiety, a propylene glycol moiety, or a combination thereof), or a combination thereof.

The organic compound may include a compound represented by Chemical Formula 1 or Chemical Formula 2:

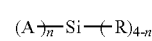 Chemical Formula 1

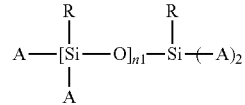 Chemical Formula 2 wherein n is an integer from 1 to 3,
n1 is an integer from 1 to 10, and
group A of Chemical Formulae 1 or 2 is the same or different, and is each independently a hydroxyl group, a substituted or unsubstituted C1 to C10 alkoxy group, chlorine, —O* (wherein * represents a portion linked to or connected to the surface of the luminescent nanostructure), or a combination thereof, provided that at least one A is —O*.
group R of Chemical Formulae 1 or 2 is the same or different, and each independently a substituted or unsubstituted C1 (or C3) to C40 (or C10) aliphatic hydrocarbon group, a substituted or unsubstituted C6 to C40 aromatic hydrocarbon group, a substituted or unsubstituted C1 (or C3) to C40 (or C10) aliphatic hydrocarbon group in which at least one methylene is replaced by sulfonyl (—$SO_2$—), carbonyl (CO), ether (—O—), sulfide (—S—), sulfoxide (—SO—), ester (—C(=O)O—), amide (—C(=O)NR—, wherein R is hydrogen or a C1 to C10 alkyl group), or a combination thereof, a moiety represented by Chemical Formula 1-1, or a combination thereof;

Chemical Formula 1-1

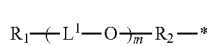

wherein, $R_1$ is hydrogen, a substituted or unsubstituted C1 to C30 alkyl ester moiety, a substituted or unsubstituted C1 to C10 alkoxy group, a hydroxy group, a carboxy group, a (meth)acrylate group, an amine group, a maleimide group, a thiol a group, or a C1 to C10 fluorinated alkoxy group, $L^1$ is a substituted or unsubstituted C1 to C10 or C2 to C5 alkylene group or a substituted or unsubstituted C1 to C10 or C2 to C5 alkylene group with one or more fluorine atoms, $R_2$ is a direct bond, a substituted or unsubstituted C1 to C20 alkylene group, sulfonyl (—$SO_2$—), carbonyl (CO), ether (—O—), sulfide (—S—), sulfoxide (—SO—), ester (—C(=O)O—), amide (—C(=O)NR—, wherein R is hydrogen or a C1 to C10 alkyl group), or a combination thereof, represents a portion connected to a Si atom of Chemical Formulae 1 or 2, and m is 0 or 1 to 40.

The amount of the organic compound in the luminescent nanostructure may be greater than or equal to about 0.1 weight percent (wt %), or greater than or equal to about 0.5 wt %, greater than or equal to about 1 wt %, or greater than or equal to about 3 wt %, based on the total weight of the luminescent nanostructure.

The amount of the organic compound in the luminescent nanostructure may be less than or equal to about 10 wt %, less than or equal to about 7 wt %, less than or equal to about 5 wt %, or less than or equal to about 4 wt % based on the total weight of the luminescent nanostructure.

The luminescent nanostructure may be configured to emit a blue light, a green light, or a combination thereof.

The blue light may have a maximum emission wavelength of greater than or equal to about 400 nm and less than or equal to about 490 nm.

The green light may have a maximum emission wavelength of greater than or equal to about 495 nm and less than or equal to about 580 nm.

Another embodiment provides a method for producing the aforementioned luminescent nanostructure. The method includes preparing a substrate including a plurality of the luminescent nanostructures, placing or positioning the substrate in a (e.g., vacuum) chamber; and vapor depositing the organic compound (e.g., by heating) on surfaces of the plurality of luminescent nanostructures in the chamber.

In an embodiment, at least a portion of the plurality of the luminescent nanostructures are arranged on the substrate in such a manner that the at least a portion of the luminescent nanostructures have one end bound (e.g., fixed) to the surface of the substrate and extend in a direction away from the surface.

The vapor deposition of the organic compound may be conducted at a temperature of greater than or equal to about 100° C. and less than or equal to about 500° C.

An embodiment provides a method for producing the aforementioned luminescent nanostructure, including: providing a plurality of the luminescent nanostructures without the organic compound;

dispersing the luminescent nanostructures in an organic solvent including the organic compound to obtain a mixture; and stirring the mixture. In an embodiment, the stirring may be conducted at a temperature of greater than or equal to about 100° C.

An embodiment provides a light emitting device including the aforementioned luminescent nanostructure.

The light emitting device may further include a conductor electrically connected to the semiconductor nanocrystal of the luminescent nanostructure.

Another embodiment provides a display device including the aforementioned luminescent nanostructure or the aforementioned light emitting device.

The luminescent nanostructure according to an embodiment may exhibit improved physical properties (e.g., dispersion characteristics, process stability, light emitting properties, electrical/magnetic properties, etc.), and therefore, the luminescent nanostructure may be used in a light emitting device or an electronic device including the luminescent nanostructures (e.g., a display device).

DETAILED DESCRIPTION

Figure 1:
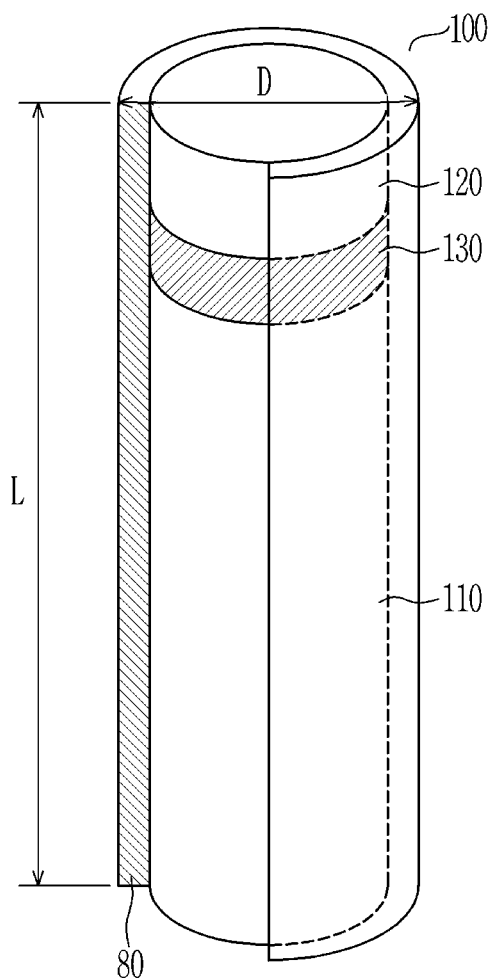
FIG. 1 shows a perspective view of a luminescent nanostructure according to a non-limiting embodiment.

Hereinafter, various embodiments of the present disclosure will be described in detail with reference to the accompanying drawings so that those of ordinary skill in the art may easily implement the present disclosure. The present disclosure may be implemented in various different forms and is not limited to the embodiments described herein.

The drawings and description are to be regarded as illustrative in nature and not restrictive. Like reference numerals designate like elements throughout the specification.

Exemplary embodiments are described herein with reference to cross section illustrations that are schematic illustrations of idealized embodiments. As such, variations from the shapes of the illustrations including the relative size and thickness of each constituent element as shown in the drawings are randomly indicated for better understanding and ease of description, and this disclosure is not necessarily limited to as shown. In the drawings, the thickness of layers, films, panels, regions, etc., are exaggerated for clarity. In addition, in the drawings, for better understanding and ease of description, the thickness of some layers and areas is exaggerated. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" or "include" and variations such as "comprises" or "comprising" will be understood to imply the inclusion of stated elements but not the exclusion of any other elements.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or ±5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In addition, in this specification, the phrase "on a plane" means viewing a target portion from the top, and the phrase "on a cross-section" means viewing a cross-section formed by vertically cutting a target portion from the side.

As used herein, the expression "not including cadmium (or optionally, another harmful heavy metal)" may refer to the case in which a concentration of each of cadmium (or another heavy metal deemed harmful) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other heavy metal) may be present or, if present, an amount of cadmium (or other heavy metal) may be less than or equal to a detection limit or as an impurity level of a given analysis tool (e.g., an inductively coupled plasma atomic emission spectroscopy).

Hereinafter, as used herein, when a definition is not otherwise provided, "substituted" refers to replacement of hydrogen of a compound by a substituent selected from a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are each independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR (wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

In addition, when a definition is not otherwise provided below, "hetero" means one including 1 to 3 heteroatoms selected from N, O, S, Si, or P.

As used herein, "alkylene group" is a linear or branched saturated aliphatic hydrocarbon group that optionally includes at least one substituent and has two or more valences.

As used herein, "arylene group" may be a functional group that optionally includes at least one substituent, and having two or more valences formed by removal of at least two hydrogens to form at least one aromatic ring.

In addition, "aliphatic hydrocarbon group" refers to a C1 to C30 linear or branched alkyl group, a C1 to C30 linear or branched alkenyl group, or a C1 to C30 linear or branched alkynyl group, "aromatic organic group" refers to a C6 to C30 aryl group or a C2 to C30 heteroaryl group, and "alicyclic organic group" refers to a C3 to C30 cycloalkyl group, a C3 to C30 cycloalkenyl group, and a C3 to C30 cycloalkynyl group.

As used herein, the term "(meth)acrylate" refers to acrylate and/or methacrylate.

As used herein, "Group" refers to a Group of Periodic Table.

As used herein, examples of "Group 13" metal include Al, In, Ga, and Tl.

Herein, the term "nanostructure" refers to at least one region having a nanoscale dimension or a structure having a characteristic dimension. In an embodiment, the dimensions of the nanostructure may be less than or equal to about 1,000 nm, less than or equal to about 900 nm, less than or equal to about 800 nm, less than or equal to about 700 nm, less than or equal to about 600 nm, less than or equal to about 500 nm, less than or equal to about 400 nm, less than or equal to about 300 nm, less than or equal to about 250 nm, less than or equal to about 150 nm, less than or equal to about 100 nm, less than or equal to about 50 nm, or less than or equal to about 30 nm. The nanostructure can be, e.g., substantially crystalline, substantially monocrystalline, polycrystalline, (for example, at least partially) amorphous, or a combination thereof.

Herein, "dispersion" refers to a dispersion in which a dispersed phase is a solid, and a continuous medium includes a liquid or a solid different from the dispersed phase. In an embodiment, the "dispersion" may be a colloidal dispersion in which the dispersed phase has a dimension of greater than or equal to about 1 nm, for example, greater than or equal to about 2 nm, greater than or equal to about 3 nm, or greater than or equal to about 4 nm and several micrometers (um) or less, (e.g., less than or equal to about 2 um, or less than or equal to about 1 um).

Herein, the mean may be median or mean. In an embodiment, the average may be mean.

An electronic device or a display device (e.g., a display panel) may include a color conversion panel and a light emitting panel light source. For example, the display panel may include a light emitting panel (or a light source), a color conversion panel (e.g., including a light emitting material such as quantum dots), and a light transmitting layer between the light emitting panel and the color conversion panel.

The light emitting panel may include a light emitting diode such as an organic light emitting diode using an organic material as a fluorescent material and an inorganic light emitting diode using an inorganic material as a fluorescent or phosphorescent material. The inorganic light emitting diodes are expected to realize improved durability and increased efficiency. As an inorganic light emitting diode, a Group 13 metal nitride-based material such as gallium nitride (e.g., a one-dimensional material extending in one direction such as a nanorod, rod, needle, etc.) is attracting attention. For Group 13 nitride-based applications, the development of very small and easy-to-handle light emitting diodes and device layouts may be desirable. A one-dimensional, Group 13-based nanostructure may be expected to improve in luminance, internal efficiency, and extraction efficiency.

The one-dimensional nanostructure of a Group 13 metal nitride may be produced by a bottom-up process or a top-down process. In the bottom-up manner, for example, a buffer layer (e.g. $SiO_2$) is patterned on sapphire and MQW InGaN/GaN, for example, may be selectively grown in a predefined area by MOCVD. After the growth of the nanorods, the sapphire substrate may be separated by a physical method or by a technique such as laser lift-off (LLO) or chemical lift-off (CLO). In the top-down manner, patterning methods such as etching techniques may be introduced in an inexpensive but efficient manner to provide high-aspect-ratio 3D GaN micro-/nanostructures. For example, for the production of GaN nano-LEDs, planar GaN LEDs may be etched with nanomasks. The GaN nanorods may be defined by various methods, for example, photolithography, electron beam lithography, nanoimprint lithography, and the like. Dry etching methods, such as RIE-ICP may be used to achieve high aspect ratios. The produced nanorods may be assembled on a backplane to form a device. In this regard, the application of inkjet printing technology has been proposed, but the nanorods may not be easily handled because of their very small dimensions.

Without wishing to be bound by any theory, a surface treatment of a light emitting material may improve availability of the one-dimensional nanostructures based on Group 13 metal nitride such as rods and the like, for a use as a light emitting material. The light emitting material as grown may be separated on a wafer and then, subjected to a subsequent process, wherein relatively large surface areas of one-dimensional nanostructures may easily cause agglomeration of particles during the process, and such physical contacts may result in damage of a surface of the light emitting material, and consequently deteriorating properties.

The luminescent nanostructure(s) according to an embodiment may exhibit a surface property that may be desired for a subsequent process for its application, which is described herein. In an embodiment, the luminescent nanostructure having such a surface may exhibit a desired dispersibility and may show a controlled surface charge and a desired electrical and/or magnetic property.

In an embodiment, the luminescent nanostructure(s) includes a semiconductor nanocrystal including a Group 13 metal nitride. The luminescent nanostructure includes an organic compound having (e.g., including) an M-O moiety (for example, being bound to) at least a portion of a surface of the nanostructure (wherein M is Ti, Al, Zr, Sn, or Si).

Without wishing to be bound by any theory, such an organic compound may provide a functional role as a protection layer for the luminescent nanostructure. The organic compounds as described herein may be bound (or bonded) to a surface of the Group 13 nitride-based nanostructure, for example, through a condensation reaction. In the luminescent nanostructure of an embodiment, the organic compound may play a role of a surface healing by bonding with —OH groups that may otherwise act as a surface defect (dangling bond) on a surface of an inorganic material. Depending on a functional group of a coupling agent, it may also play a role of changing a dispersion property in solution, controlling a surface charge, or controlling an electrical/magnetic surface property via a decoration of nano-metal/oxide particles, which may be required in a subsequent process.

Figure 2:
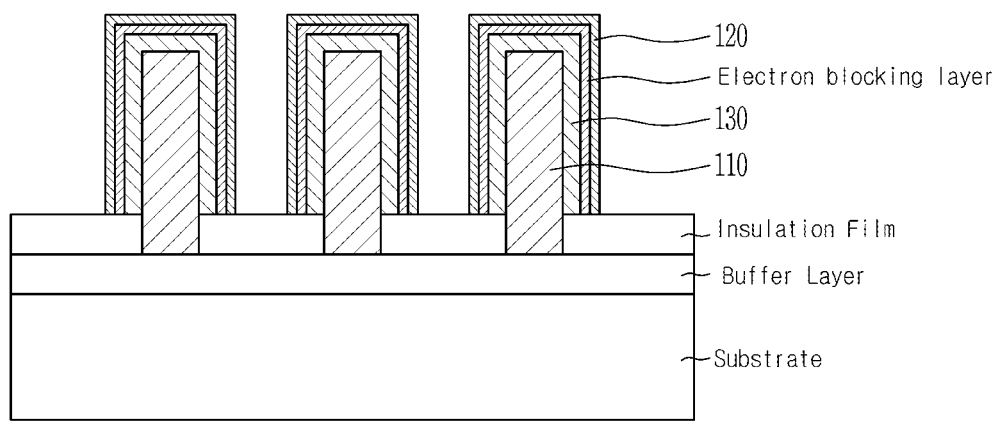
FIG. 2 shows a schematic view of a luminescent nanostructure according to a non-limiting embodiment.

Referring to FIGS. 1 and 2, the luminescent nanostructure 100 may have dimensions in micro-meters or nano-meters. In an embodiment, the luminescent nanostructure 100 or the semiconductor nanocrystal including a Group 13 metal nitride may include a first semiconductor material 110, a second semiconductor material 120, or a combination thereof. The luminescent nanostructure may further include an active layer 130, an insulating layer 80, an electron blocking layer, or a combination thereof.

The luminescent nanostructure may be an inorganic light emitting diode made of an inorganic material. The inorganic light emitting diode may receive a predetermined electrical signal from an electrode and emit light in a specific wavelength band.

The luminescent nanostructure 100 may have a shape extending in one direction. The luminescent nanostructure 100 may have a shape such as a nanorod, a nanowire, or a nanotube.

In an embodiment, a cross-section of the luminescent nanostructure 100 perpendicular to its length may be substantially a circle or an ellipse, or a polygon (e.g., a triangle, a square, a pentagon, a hexagon, etc.), but is not limited thereto. The cross-section may have any shape. The luminescent nanostructure may be cylindrical or rod-shaped. A longitudinal cross-section of the luminescent nanostructure parallel to its length may have any shape, such as a cube, a rectangular parallelepiped, or a hexagonal prism. The longitudinal cross-section of the luminescent nanostructure may have a shape for example, a needle shape, or a truncated polygonal pyramid or a truncated cone.

The luminescent nanostructure may have a longitudinally extended shape. (for example, see FIG. 1 or FIG. 2) The luminescent nanostructure 100 may have an aspect ratio of greater than or equal to about 1, for example, greater than or equal to about 2, greater than or equal to about 2.5, greater than or equal to about 3, greater than or equal to about 3.5, greater than or equal to about 4, greater than or equal to about 4.5, or greater than or equal to about 5. The nanostructure may have an aspect ratio of greater than about 1, about 1.5, greater than or equal to about 2.0, greater than or equal to about 3.0, greater than or equal to about 4.0, greater than or equal to about 4.5, greater than or equal to about 5.0, greater than about 1 and less than or equal to about 100, about 1.5 to about 60, about 2.0 to about 50, about 3.0 to about 40, about 4.0 to about 30, about 4.5 to about 25, or about 5.0 to about 10.

As used herein, the term "aspect ratio" refers to a ratio (L/D) of a length (L) of the luminescent nanostructure to a diameter (D) of the luminescent nanostructure. The diameter D may be a longest length of a straight line that intersects a center of the cross-section of the luminescent nanostructure.

The luminescent nanostructure may have a length (L) of greater than or equal to about 1 μm, greater than or equal to about 1.2 μm, greater than or equal to about 1.5 μm, greater than or equal to about 1.7 μm, greater than or equal to about 1.8 μm, or greater than or equal to about 5.3 μm and less than or equal to about 10 μm, less than or equal to about 6 μm, less than or equal to about 5.5 μm, less than or equal to about 5 μm, or less than or equal to about 3 μm. The luminescent nanostructure may have a diameter (D) of less than or equal to about 1.5 μm, less than or equal to about 1 μm, or less than or equal to about 0.7 μm. The luminescent nanostructure may have a diameter (D) of 300 nm to about 700 nm.

The luminescent nanostructure may have a diameter (D) of greater than or equal to about 50 nm, greater than or equal to about 100 nm, greater than or equal to about 150 nm, greater than or equal to about 200 nm, greater than or equal to about 250 nm, or greater than or equal to about 300 nm. The luminescent nanostructure may have a diameter (D) of less than or equal to about 1500 nm, less than or equal to about 1200 nm, less than or equal to about 1000 nm, less than or equal to about 900 nm, less than or equal to about 800 nm, or less than or equal to about 700 nm.

The luminescent nanostructure may not contain or include cadmium or optionally, other harmful heavy metals such as lead.

The Group 13 metal nitride may include a gallium nitride, an indium nitride, an indium gallium nitride, an aluminum nitride, an aluminum gallium nitride, an indium aluminum gallium nitride, or a combination thereof.

The semiconductor nanocrystals may include semiconductor nanocrystals doped with impurities. The doped semiconductor nanocrystals may include a p-type doped first semiconductor material or n-type, a n-type doped second semiconductor material or p-type, or a combination thereof.

In an embodiment, the luminescent nanostructure may further include an electrode layer (not shown) on the first semiconductor material 110 or the second semiconductor material 120. In the luminescent nanostructure of an embodiment, the semiconductor nanocrystals may form a structure sequentially disposed or arranged in its length direction. See FIG. 1). In the luminescent nanostructure of another embodiment, the semiconductor nanocrystals may be stacked in its radial direction (see FIG. 2).

The luminescent nanostructure may include a first semiconductor material 110 doped with n-type or p-type (e.g., a first conductive semiconductor or semiconductor nanocrystal), and a second semiconductor material 120 doped with p-type or n-type) (e.g., a second conductive semiconductor or semiconductor nanocrystal), and an active layer 130 disposed between the first semiconductor material and the second semiconductor material. The active layer may include a material of a quantum well structure. The luminescent nanostructure may further include an insulating layer (or a protective layer) on an outer surface of the luminescent nanostructure. The insulating layer (or protective layer) may include a metal oxide. The metal oxide may include an aluminum oxide, a silicon oxide, or a combination thereof.

In an embodiment, the first semiconductor material 110 may be an n-type semiconductor. The first semiconductor material may be a p-type semiconductor. The second semiconductor material 120 may be disposed on the first semiconductor 110. The second semiconductor material 120 may be a p-type semiconductor. The second semiconductor material may be an n-type semiconductor. The length of the first semiconductor material may range from about 1.5 micrometers (μm) to about 5 μm but is not limited thereto. The length of the second semiconductor material may range from about 0.08 μm to about 0.25 μm, but is not limited thereto.

In an embodiment, the n-type semiconductor (e.g., the first semiconductor material) may include a semiconductor material having the chemical formula $In_xAl_yGa_{1-x-y}N$ ($0 \leq x \leq 1$, $0 \leq y \leq 1$, and $0 \leq x+y \leq 1$). The n-type semiconductor may be n-type doped InAlGaN, GaN, AlGaN, InGaN, AlN, InN, or a combination thereof. The n-type dopant may be Si, Ge, Sn, or a combination thereof. In an embodiment, the n-type semiconductor may be n-GaN doped with Si.

When the luminescent nanostructure 100 emits light in a blue or green region of the visible spectrum, the second semiconductor material may include a semiconductor material having chemical formula of $In_xAl_yGa_{1-x-y}N$ ($0 \leq x \leq 1$, $0 \leq y \leq 1$, $0 \leq x+y \leq 1$). For example, the second semiconductor material may include any of InAlGaN, GaN, AlGaNN, InGaN, AlN, InN, or a combination thereof, which may be doped with p-type. The second semiconductor material may be doped with a second conductive dopant, and the second conductive dopant may include, for example, Mg, Zn, Ca, Se, Ba, and the like. In an embodiment, the second semiconductor material may be p-GaN doped with p-type Mg.

The first semiconductor material 110 may be formed into a single layer or a plurality of layers. The second semiconductor material may be formed into a single layer or a plurality of layers. The first semiconductor material and the second semiconductor material may each independently further include a clad layer, a TSBR (tensile strain barrier reducing) layer, or a combination thereof.

In an embodiment, the active layer 130 may be disposed between the first semiconductor material 110 and the second semiconductor material 120. The active layer 130 may include a material for forming a single or multiple quantum well structure. In an embodiment, the active layer 130 may include a multiple quantum well structure, and a plurality of quantum layers and well layers may be alternately stacked. In the active layer 130, electrons and holes supplied through the first semiconductor material and the second semiconductor material may be combined into pairs and thereby the structure may emit light of a desired color (e.g., blue light, green light, or a combination thereof). In a non-limiting embodiment, the quantum well may include a thin layer (i.e. a well layer) of one type of semiconductor material sandwiched between two layers of another semiconductor material with a different (e.g., wider) band-gap. For example, and without limitation, in the quantum well structure, two layers of one semiconductor material with a large bandgap may surround a thin layer of another semiconductor material with a smaller band-gap. In the embodiment, the change in material layers occurs along the z-direction, the potential well may be along the z-direction (with substantially no confinement in the x-y plane.). In an embodiment, the bandgap of the sandwiched material may be lower than the surrounding semiconductor material, and a quantum well (Potential well) may be created in a region of the sandwiched semiconductor material.

In an embodiment, the active layer 130 may emit light a wavelength in the blue region of the visible spectrum, and it may include a material such as AlGaN, AlInGaN, or the like. In an embodiment, the active layer 130 may have a quantum well structure including the quantum layers and the well layers alternately stacked with each other, the quantum layers may include AlGaN or AlInGaN, and the well layers may include GaN, AlInN, or the like. In an embodiment, the active layer 130 may include AlGaInN as a quantum layer and AlInN as a well layer and, as described above, and the luminescent nanostructure may emit blue light having a luminescent peak wavelength in a range from about 450 nm to about 495 nm.

In an embodiment, the active layer 130 may have a structure such that a semiconductor material with a relatively large bandgap energy and a semiconductor material with a relatively small bandgap energy are alternately stacked, each of which including a Group III-V semiconductor material that is different from the other, and depending on the wavelength of light emitted. The emitted light from the active layer 130 may include an emission band of blue light, an emission band of green light, or an emission band of red light.

The active layer 130 may have a length of about 0.05 μm to about 0.25 μm, but is not limited thereto.

The luminescent nanostructure(s) may be configured to emit blue light, green light, or a combination thereof. In an embodiment, the emitted light may include emission bands with bands in the blue and the green regions of the visible spectrum. The blue light may have a luminescent (emission) peak wavelength of greater than or equal to about 400 nm, greater than or equal to about 410 nm, greater than or equal to about 420 nm, greater than or equal to about 430 nm, greater than or equal to about 440 nm, or greater than or equal to about 450 nm. The blue light may have a luminescent (emission) peak wavelength of less than or equal to about 490 nm (or about 495 nm), less than or equal to about 480 nm, less than or equal to about 470 nm, or less than or equal to about 460 nm.

The green light may have a luminescent (emission) peak wavelength of greater than or equal to about 495 nm, greater than or equal to about 500 nm, greater than or equal to about 510 nm, or greater than or equal to about 520 nm. The green light may have a luminescent (emission) peak wavelength of less than or equal to about 580 nm, less than or equal to about 570 nm, less than or equal to about 560 nm, less than or equal to about 550 nm, or less than or equal to about 545 nm.

The luminescent nanostructure may further include a conductive electrode layer on the semiconductor nanocrystals (e.g., the first semiconductor material or the second semiconductor material). The electrode layer may include an ohmic contact electrode, a Schottky contact electrode, or a combination thereof. The conductive electrode may include a conductive metal. The conductive metal may include a transparent conductive material such as indium tin oxide (ITO) or indium zinc oxide (IZO) or a light-blocking material such as gold (Au), platinum (Pt), nickel (Ni), tungsten (W), chromium (Cr), molybdenum (Mo), iron (Fe), cobalt (Co), copper (Cu), palladium (Pd), titanium (Ti), and the like. The conductive electrode layer may include a semiconductor material doped with n-type or p-type.

The luminescent nanostructure may further include an insulating layer or a protective layer (a passivation layer) surrounding the above semiconductor nanocrystals to protect the outer surface. The insulating layer 80 may be disposed to surround an outer surface of the first semiconductor material 110, an outer surface of the second semiconductor material 120, an outer surface of the active layer 130, or a combination thereof. The insulating layer may extend in a length direction of the luminescent nanostructure. The insulating layer 80 may be formed to surround the outer surface extending in the length direction of the luminescent nanostructure. The insulating layer may be formed to expose both longitudinal ends (i.e., top and bottom) of the luminescent nanostructure 100.

The insulating layer or the protective layer 80 may include a material of an insulating property, for example, silicon oxide ($SiO_x$), silicon nitride ($SiN_x$), aluminum oxide ($Al_2O_3$), aluminum nitride, silicon oxynitride ($SiO_xN_y$) aluminum nitride (AlN), or a combination thereof.

The insulating layer or protective layer may be provided to passivate a portion of the semiconductor nanocrystals (e.g., the first semiconductor material, the second semiconductor material, or the active layer). The insulating layer or protective layer may be provided to passivate the semiconductor nanocrystals (e.g., the first semiconductor material, the second semiconductor material, and the active layer).

A thickness of the insulating layer 80 may be greater than or equal to about 5 nm, greater than or equal to about 10 nm, greater than or equal to about 15 nm, greater than or equal to about 20 nm, greater than or equal to about 30 nm, greater than or equal to about 40 nm, or greater than or equal to about 100 nm. The thickness of the insulating layer may be less than or equal to about 1.0 µm, less than or equal to about 900 nm, less than or equal to about 500 nm, or less than or equal to about 400 nm.

The semiconductor material for the luminescent nanostructure 100 may be prepared in a top-down manner or a bottom-up manner. A specific preparation method is appropriately selected. It may be prepared by an epitaxial growth method. The luminescent nanostructure 100 may be prepared by forming a seed crystal layer on a substrate and depositing a predetermined semiconductor material to grow the semiconductor crystal. The luminescent nanostructures disposed on the substrate may be separated by physical or chemical methods.

Figure 3A:
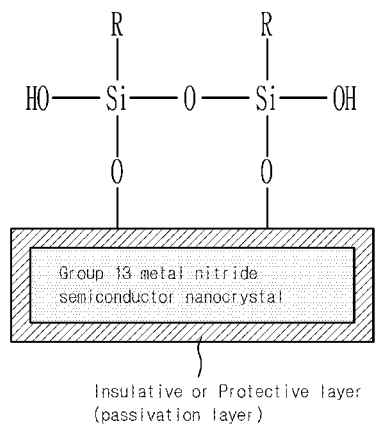
FIG. 3A is a schematic cross-sectional view of a luminescent nanostructure according to a non-limiting embodiment.
Figure 3B:
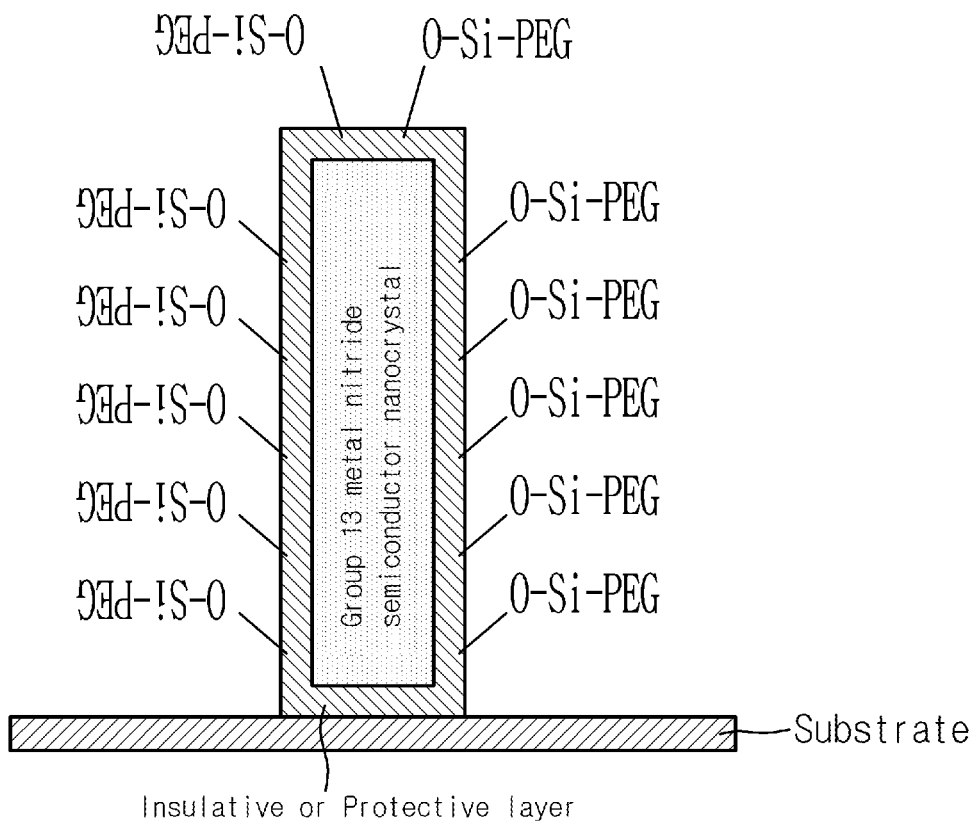
FIG. 3B is a schematic cross-sectional view of a luminescent nanostructure according to a non-limiting embodiment.

The luminescent nanostructure may further include, for example, an organic compound having an M-O moiety (wherein M is Ti, Al, Zr, Sn, or Si) disposed on or bound to (e.g., bonded to) a portion of its surface. In an embodiment, the organic compound may be disposed on or bound to the aforementioned insulating layer or protective layer. In an embodiment, the organic compounds may be bound to the surface of the luminescent nanostructures via a moiety including *—O-M on the surface (* represents a portion or a moiety that is linked or connected to the surface of the structure, for example, *—O-M-R, R is defined as described later). Referring to FIGS. 3A and 3B, the moiety including *—O-M may be a moiety including *—O—Si.

In an embodiment, the organic compound "binding" or "bonding to" the luminescent nanostructure may include a bond (e.g., a chemical bond such as a covalent bond or an ionic bond) or a physical interaction (e.g., a form of van der Waal interaction therebetween. The organic compound "bound" or "bonded" to the luminescent nanostructure may not be removed (or detached) therefrom by a simple washing (e.g., stirring or dispersing) in a solvent (e.g., an organic solvent) that can disperse the luminescent nanostructures, for example, at room temperature.

The organic compound may include at least one or two alkylene oxide moiety (e.g., ethylene oxide moiety or propylene oxide moiety). In an embodiment, the organic compound may include a repeating unit represented by *-L-O—*, wherein L is a substituted or unsubstituted $C_{2-10}$ alkylene, and * is a portion that is linked or connected to an adjacent atom(s) in the organic compound. The organic compound or a layer including the organic compound may include a Si—O—Si linkage. The organic compound may include an organosilicon compound containing a Si—O—Si linkage.

The organic compound may include a carboxylate moiety, a phosphite moiety, a sulfonate moiety, an amine moiety, a carboxylic acid, an alkylene glycol (e.g., ethylene glycol, propylene glycol, or a combination thereof) moiety, or a combination thereof.

The organic compound may include a compound represented by Chemical Formula 1 or Chemical Formula 2:

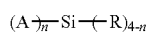

Chemical Formula 1

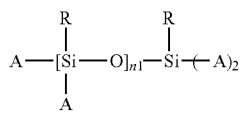

Chemical Formula 2 wherein, n is an integer of 1 to 3 (1, 2, or 3),
n1 is 0 or an integer from 1 to 10, and
each group A of Chemical Formulae 1 or 2 are the same or different, and each are independently a hydroxyl group, a substituted or unsubstituted C1 to C10 alkoxy group, chlorine, —O*, wherein * represents a connection or is a portion linked or connected to the surface of the luminescent nanostructure, or a combination thereof, provided that at least one A is —O*.

Each group R of Chemical Formulae 1 or 2 are the same or different, and each are independently a C1 (or C3) to C40 (or C10) substituted or unsubstituted aliphatic hydrocarbon group, a C6 to C40 substituted or unsubstituted aromatic hydrocarbon group, a C1 (or C3) to C40 (or C10) substituted or unsubstituted aliphatic hydrocarbon group in which at least one methylene is replaced by sulfonyl (—$SO_2$—), carbonyl (CO), ether (—O—), sulfide (—S—), sulfoxide (—SO—), ester (—C(=O)O—), amide (—C(=O)NR—, wherein R is hydrogen or a C1 to C10 alkyl group), a moiety represented by Chemical Formula 1-1, or a combination thereof;

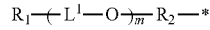

Chemical Formula 1-1 wherein, $R_1$ is hydrogen, a halogen, a substituted or unsubstituted C1 to C30 alkyl ester moiety, a substituted or unsubstituted C1 to C10 alkoxy group, a hydroxy group, a carboxyl group, (meth)acrylate group, amine group, maleimide group, a thiol group, or C1 to C10 fluorinated alkoxy group, $L^1$ is a direct bond, a substituted or unsubstituted C1 to C5 alkylene group or a substituted or unsubstituted C1 to C5 fluorinated alkylene group, $R_2$ is a direct bond, a substituted or unsubstituted C1 to C20 alkylene group, sulfonyl (—$SO_2$—), carbonyl (—CO—), ether (—O—), sulfide (—S—), sulfoxide (—SO—), ester (—C(=O)O—), amide (—C(=O)NR—, wherein R is hydrogen or a C1 to C10 alkyl group), or a combination thereof,

* is a portion linked to or connected to (or represents a connection point) to a Si atom of Chemical Formulae 1 or 2, and m is 0 or 1 to 40.

The organic compound may include an organosilane compound represented by Chemical Formula 1-1-1:

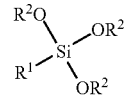

Chemical Formula 1-1-1 wherein, $R^1$ is hydrogen, a C1 to C30 (e.g., C3 or C5 to C16) alkyl group, a C1 to C30 (e.g., C3 or C5 to C16) mercaptoalkyl group, a C1 to C30 (e.g., C3 or C5 to C16) C16) alkyl group substituted with a (meth)acrylate group, a C1 to C30 (e.g., C3 or C5 to C16) alkyl group substituted with a vinyl group, or a C1 to C30 (e.g., C3 or C5 to C16) alkyl group substituted with an epoxy group, and each R2 are the same or different, and each are independently hydrogen or a C1 to C3 alkyl group, —O* (where * is a portion linked to a surface of the luminescent nanostructure), or a combination thereof.

The organic compound may include an organosilane oligomer represented by Chemical Formula 1-1-2, Chemical Formula 1-1-3, or Chemical Formula 1-1-4:

Chemical Formula 1-1-2

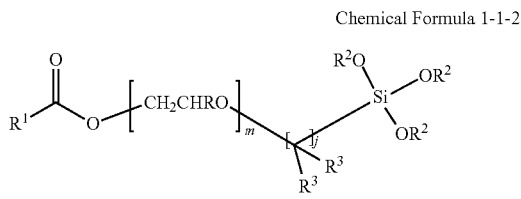

wherein, $R^1$ is hydrogen, or a C1 to C15 alkyl group,
R is the same or different and each independently hydrogen or a substituted or unsubstituted C1 to C5 alkyl group,
m is an integer from 1 to 5,
each $R^2$ are the same or different and each are independently hydrogen or a C1 to C3 alkyl group, —O*, wherein, * is a portion linked to a surface of the luminescent nanostructure, or a combination thereof,
each $R^3$ are the same or different and each are independently hydrogen or a methyl group, and
j is 0 or an integer from 1 to 20 (e.g., 1 to 10), Chemical Formula 1-1-3

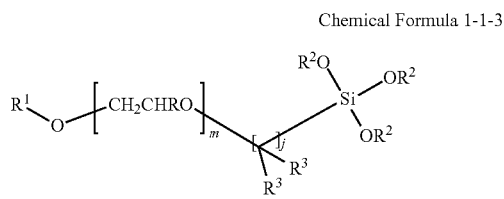

wherein, $R^1$ is hydrogen or a C1 to C3 alkyl group,
R is the same or different and each independently hydrogen or a substituted or unsubstituted C1 to C5 alkyl group,
m is an integer from 1 to 30,
each $R^2$ are the same or different, and each are independently hydrogen or a C1 to C3 alkyl group, —O*, wherein, * is a portion linked to the surface of the luminescent nanostructure, or a combination thereof,
each $R^3$ are the same or different and each are independently hydrogen or a methyl group, and
j is 0 or an integer from 1 to 20, Chemical Formula 1-1-4

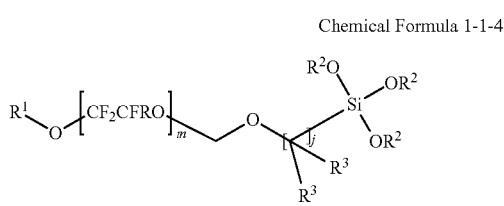

wherein, $R^1$ is a C1 to C10 fluorinated alkyl group,
R is the same or different and each independently hydrogen, fluorine, a substituted or unsubstituted C1 to C10 alkyl group, or a substituted or unsubstituted C1 to C10 fluorinated alkyl group,
m is an integer from 1 to 30,
each $R^2$ are the same or different, and each are independently hydrogen or a C1 to C3 alkyl group, —O*, wherein, * is a portion linked to a surface of the luminescent nanostructure, or a combination thereof,
each $R^3$ are the same or different, and each are independently hydrogen or a methyl group, and
j is 0 or an integer from 1 to 20 (e.g., 1 to 10).

The organic compound (e.g., the organosilane oligomer) may have a weight average molecular weight of greater than or equal to about 100 g/mol, greater than or equal to about 150 g/mol, or greater than or equal to about 200 g/mol and less than or equal to about 5000 g/mol, less than or equal to about 4500 g/mol, less than or equal to about 4000 g/mol, less than or equal to about 3500 g/mol, less than or equal to about 3000 g/mol, less than or equal to about 2500 g/mol, less than or equal to about 2000 g/mol, less than or equal to about 1500 g/mol, less than or equal to about 1000 g/mol, or less than or equal to about 650 g/mol.

The luminescent nanostructure may have desired dispersion property, for example, due to the inclusion of the organic compounds, for example, exhibit controlled surface charges. In addition, the organic compounds may play a role of imparting a desired electrical and/or magnetic property to the luminescent nanostructure. In an embodiment, the luminescent nanostructure may include a relatively uniform, organic passivation layer on the surface, which may arise from presence of the organic compound on the surface, and may effectively prevent a physical contact among neighboring or adjacent nanostructures during a subsequent process (dry, wet environment) and also suppress agglomeration of the nanostructures.

In the luminescent nanostructure of an embodiment, an —OH group that may otherwise act as a structural/electrical surface defect may be combined with the organic compound, providing a healing of the surface defect. In addition, the luminescent nanostructure (e.g., gallium nitride) may be controlled with respect to the electrical/magnetic characteristics resulting from the organic compound, and thereby, have surface decoration (formation of ionic salt, nano-metal, nano-oxide).

The organic compound may protect the luminescent nanostructure (e.g., as an organic passivation layer). The organic protection layer may be disposed on (or bound to) the insulating layer or the protective layer. The organic protection layer may be provided on bound to the surface defect of the luminescent nanostructure and thus provide a defect healing effect, and also, provide an additional protection layer, e.g., prevent surface damage to GaN.

In an embodiment, the organic compound may have a different functional group in order to control dispersibility, a surface charge, a surface decoration, or a combination thereof. In an embodiment, the organic compound may include an alkyl functional group to enhance the dispersion of the nanostructures in a non-polar solvent. In an embodiment, the organic compound may have an alkylene glycol functional group (PEG) such as a polyethylene glycol moiety for a dispersion of the nanostructures in a polar solvent. In an embodiment, the organic compound may have a functional group such as —COOH, —$PO_3$, —$SO_3$, —$NH_2$, and the like in order to control the surface charge. In an embodiment, the organic compound may have a —COOH functional group for a surface decoration.

In the luminescent nanostructure, the amount of the organic compound may be greater than or equal to about 0.1 wt %, or greater than or equal to about 0.5 wt %, greater than or equal to about 1 wt %, greater than or equal to about 1.5 wt %, greater than or equal to about 2 wt %, greater than or equal to about 2.5 wt %, greater than or equal to about 3 wt %, or greater than or equal to about 3.5 wt % based on the total weight of the luminescent nanostructure. In the luminescent nanostructure, the amount of the organic compound may be less than or equal to about 10 wt %, less than or equal to about 9 wt %, less than or equal to about 8 wt %, less than or equal to about 7 wt %, less than or equal to about 6 wt %, less than or equal to about 5 wt %, less than or equal to about 4 wt %, or less than or equal to about 3 wt % based on the total weight of the luminescent nanostructure.

The amount and/or the type of the organic compound in the luminescent nanostructure may be confirmed through an appropriate analytical means (e.g., thermogravimetric analysis, Py-GC, or gas chromatography, Fourier transfer infrared (FTIR) spectroscopy, EGA, etc.).

The aforementioned luminescent nanostructures may be produced, for example, by dry or wet methods.

Figure 4:
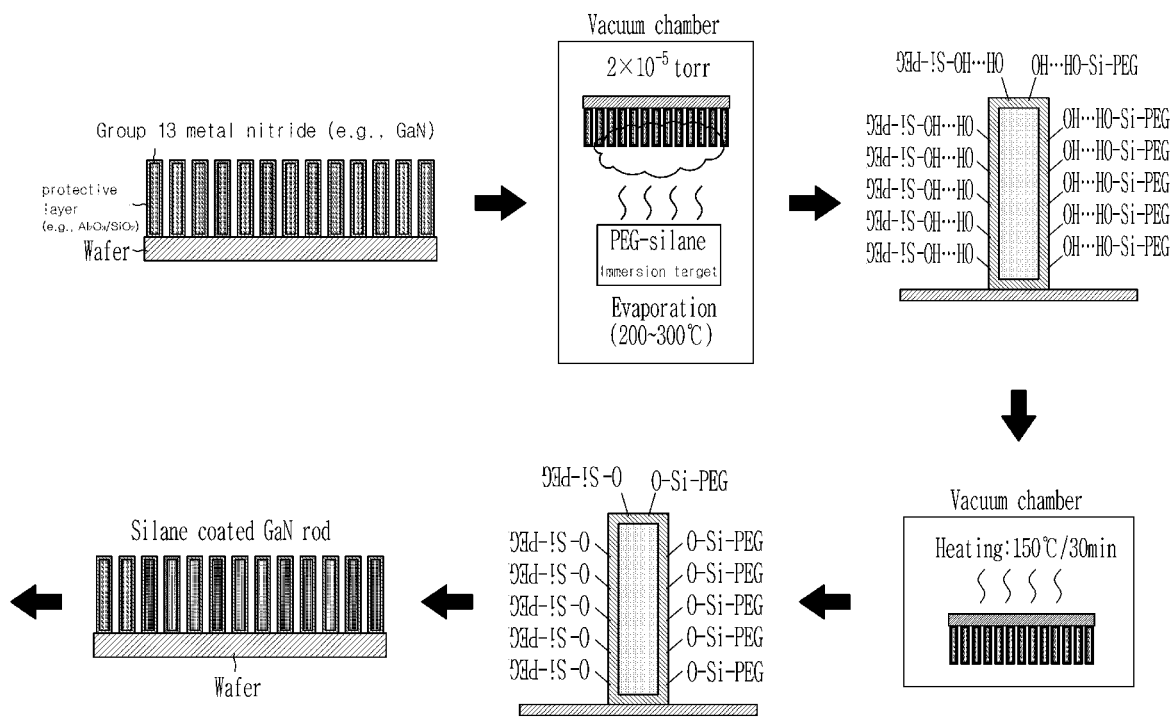
FIG. 4 is a schematic representation of a method of producing a luminescent nanostructure according to a non-limiting embodiment.

Referring to FIG. 4, a producing method according to an embodiment includes preparing a substrate including a plurality of the luminescent nanostructures, and as indicated without the organic compound present;
positioning or placing the substrate into a (e.g., vacuum or inert gas) deposition chamber; and
vapor depositing (e.g., by heating) the organic compound on surface of the plurality of luminescent nanostructures in the deposition chamber.

The degree of vacuum in the vacuum chamber may be appropriately adjusted to less than or equal to about $10^{-3}$ torr, less than or equal to about $10^{-4}$ torr, or less than or equal to about $10^{-5}$ torr, but is not limited thereto.

In a method of an embodiment, the plurality of the luminescent nanostructures may be arranged on the substrate in such a manner that the luminescent nanostructures have one end bound to (e.g., fixed to) the surface of the substrate and extended in a direction away from the surface (see FIG. 4). According to a method of an embodiment, a nitride structure may be surface-treated relatively uniformly on the wafer, on which it is formed.

In an embodiment, the vapor depositing of the organic compound may be carried out at a temperature of greater than or equal to about 100° C., greater than or equal to about 150° C., or greater than or equal to about 200° C., and less than or equal to about 500° C., less than or equal to about 400° C., less than or equal to about 350° C., less than or equal to about 300° C., or less than or equal to about 280° C.

After vapor-depositing the organic compound, the luminescent nanostructure may be heat-treated again in the chamber. A temperature of the heat treatment is not particularly limited but may be selected appropriately. The heat treatment may be conducted at a temperature of greater than or equal to about 100° C. or greater than or equal to about 130° C. and less than or equal to about 300° C., less than or equal to about 200° C., or less than or equal to about 180° C. for a time of less than or equal to about 3 hours, less than or equal to about 2 hours, less than or equal to about 1 hour or greater than or equal to about 1 minute, greater than or equal to about 10 minutes, or greater than or equal to about 20 minutes.

A group 13 metal nitride nanorod coated with a silane compound may be separated from the wafer in a method (a physical method or a chemical method, for example, a Laser lift off (LLO) process or a chemical lift off (CLO), and the like, but may not be limited thereto.

An embodiment provides a (wet) method for producing the aforementioned luminescent nanostructure, including:
dispersing a plurality of the luminescent nanostructures without the organic compound in a medium (e.g., an organic solvent) including the organic compound to obtain a mixture; and
stirring the mixture.

The medium may include a substituted or unsubstituted alkane organic solvent such as hexane, heptane, octane, or the like. The medium may further include a carboxylic acid compound such as acetic acid and the like, water, or a combination thereof. In the medium, contents of the luminescent nanostructure and the organic compound may be appropriately adjusted without a particular limit.

The stirring may be carried out at an elevated temperature (e.g., greater than or equal to about 50° C., greater than or equal to about 70° C., or greater than or equal to about 90° C., and greater than or equal to about 200° C.). The stirring time is not particularly limited but appropriately selected. The stirring time may be greater than or equal to about 1 hour or greater than or equal to about 2 hours. The stirring time may be less than or equal to about 10 days, less than or equal to about 5 days, less than or equal to about 3 days, less than or equal to about 48 hours, or less than or equal to about 24 hours.

Another embodiment provides a light emitting device including the aforementioned luminescent nanostructure. The light emitting device may further include a conductor electrically connected to the semiconductor nanocrystal of the luminescent nanostructure. The aforementioned luminescent nanostructure or the aforementioned light emitting device may be utilized, for example, as a light emitting panel in a display device.

A display panel according to an embodiment includes a light emitting panel; and a color conversion panel having a surface opposite a surface of the light emitting panel. The display panel according to an embodiment may further include a light transmitting layer between the light emitting panel and the color conversion panel, a binder for combining the light emitting panel and the color conversion panel, or a combination thereof.

In an embodiment, the light emitting panel and the color conversion panel may face each other with the light transmitting layer therebetween and the color conversion panel may be disposed in a manner in which light is emitted from the light emitting panel. The binder may be disposed along the edges of the light emitting panel and the color conversion panel and may be, for example, a sealing material.

A display panel according to an embodiment may include a display area for displaying an image and a non-display area disposed around the display area and in which the binder is disposed.

The display area may include a plurality of pixels PXs arranged along a row (e.g., x direction) and/or a column (e.g., y direction), and each pixel PX may include a plurality of sub-pixels $PX_1$, $PX_2$, and $PX_3$ displaying different colors.

Each of the sub-pixels may be configured to display a color of three primary colors or a combination of three primary colors, for example, red, green, blue, or a combination thereof. For example, the first sub-pixel may be configured to display red, the second sub-pixel may be configured to display green, and the third sub-pixel may be configured to display blue. The light emitting panel may include a light emitting device configured to emit light of a predetermined wavelength region and a circuit device for switching and/or driving the light emitting device. The light emitting panel of an embodiment may include a lower substrate, a buffer layer, a thin film transistor, a light emitting device, and optionally an encapsulation layer.

The lower substrate may be an inorganic material substrate (e.g. a glass substrate) or an organic material substrate (e.g., a polymer substrate). In an embodiment, the lower substrate may be a polymer substrate including a flexible polymer substrate. The buffer layer may include an organic material, an inorganic material, or an organic-inorganic material. The buffer layer 111 may include, for example, an oxide, a nitride, or an oxynitride, and may include, for example, silicon oxide, silicon nitride, silicon oxynitride, or a combination thereof, but is not limited thereto. The buffer layer may be one layer or two or more layers, and may cover most, if not all, of the surface of the lower substrate. The buffer layer may be omitted.

The thin film transistor (TFT) may be a three-terminal element for switching and/or driving the light emitting device, which will be described later, and one TFT or two or more TFT's may be included for each sub-pixel. The thin film transistor (TFT) includes a gate electrode, a semiconductor layer overlapped with the gate electrode, a gate insulating layer between the gate electrode and the semiconductor layer, and a source electrode and a drain electrode electrically connected to the semiconductor layer. A protective film may be formed on the thin film transistor (TFT). The protective film may be, for example, a passivation film.

The light emitting devices may be disposed on a plurality of pixels, for example, sub-pixel $PX_1$, $PX_2$, and $PX_3$, and the light emitting devices in each sub-pixel $PX_1$, $PX_2$, and $PX_3$ may be independently driven. The light emitting device may be, for example, a light emitting diode, and may include a pair of electrodes and a light emitting layer between the pair of electrodes. The light emitting layer may include a light emitting body that emits light in a predetermined wavelength region. The light emitting layer may include a light emitting body emitting light of a first emission spectrum that spans the visible wavelength spectrum.

In the light emitting panel according to an embodiment, the light emitting device may be disposed for each sub-pixel $PX_1$, $PX_2$, and $PX_3$. The light emitting device disposed in each sub-pixel $PX_1$, $PX_2$, and $PX_3$ may be independently driven.

The light emitting device may be a light emitting diode including the aforementioned luminescent nanostructure. The light emitting device may include a pair of electrodes and a light emitting layer between the pair of electrodes. The light emitting layer may include the aforementioned luminescent nanostructure capable of emitting light in a predetermined wavelength region. The amount of the luminescent nanostructure is the same as described above.

The light emitting device may include a first electrode, a second electrode, and a light emitting layer including a plurality of nanostructures. One of the first electrode and the second electrode may be an anode and the other may be a cathode. The first electrode and the second electrode may be electrodes patterned according to arrangement directions of the plurality of nanostructures, and may include, for example conductive oxides such as indium tin oxide (ITO), indium zinc oxide (IZO), zinc oxide (ZnO), tin oxide (SnO), aluminum tin oxide (AITO), and fluorine-doped tin oxide (FTO); silver (Ag), copper (Cu), aluminum (Al), gold (Au), titanium (Ti), chromium (Cr), nickel (Ni), an alloy thereof, a nitride thereof (e.g., TiN); or a combination thereof, but are not limited thereto.

The light emitting layer may include a plurality of nanostructures and each sub-pixel may include a plurality of nanostructures. The plurality of nanostructures may be arranged along one direction, but the present disclosure is not limited thereto. The nanostructures may emit light of a predetermined wavelength upon application of an electric current.

A display panel according to an embodiment includes a color conversion panel. The color conversion panel may receive an excitation light (e.g., a mixed light) supplied from the light emitting panel, and then emit light having an emission spectrum different from the luminescent spectrum of the excitation light. The emitted light from the color conversion layer may be directed toward the observer. The color conversion panel includes a color conversion layer including a color conversion region, wherein the color conversion region includes a first region corresponding to a red pixel, the first region may include a first composite including a matrix and luminescent materials (e.g., quantum dots) disposed in the matrix and configured to convert the luminescent spectrum of the excitation light.

The color conversion panel may convert light having a first emission spectrum supplied from the light emitting panel into light having a second or third emission spectrum different from the first emission spectrum and may be emitted toward an observer (not shown).

The upper substrate may be a glass substrate or a polymer substrate. The color conversion layer faces the light emitting device of the light emitting panel. The color conversion layer may include at least one color conversion region for converting an emission spectrum of light supplied from the light emitting panel and the color conversion region may convert, for example, light of an emission spectrum supplied from the light emitting panel into light of an emission spectrum of a color displayed in each sub-pixel.

The color conversion region may include a color converter that converts the spectrum of light supplied from the light emitting panel into another emission spectrum. For example, the color converter may include quantum dots, phosphors, or a combination thereof.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

100: luminescent nanostructure
120: second semiconductor material
110: first semiconductor material
130: active layer
80: insulating layer or protective layer

What is claimed is:

1. A luminescent nanostructure, comprising
  a semiconductor nanocrystal comprising a Group 13 metal nitride, wherein the luminescent nanostructure does not include cadmium, and
  has an aspect ratio of greater than or equal to about 1, and
  an organic compound having an M-O moiety, wherein M is Ti, Al, Zr, Sn, or Si, that is bound to at least a portion of a surface of the luminescent nanostructure,
  wherein the luminescent nanostructure comprises a p-type doped first semiconductor material, a n-type doped second semiconductor material, and an active layer disposed between the first semiconductor material and the second semiconductor material.

2. The luminescent nanostructure of claim 1, wherein the Group 13 metal nitride comprises gallium nitride, indium nitride, indium gallium nitride, aluminum nitride, aluminum gallium nitride, indium aluminum gallium nitride, or a combination thereof.

3. The luminescent nanostructure of claim 1, wherein the active layer comprises a material having a quantum well structure.

4. The luminescent nanostructure of claim 1, wherein
the luminescent nanostructure further comprises an insulating layer on an outer surface of the luminescent nanostructure, and
the insulating layer comprises a metal oxide.

5. The luminescent nanostructure of claim 4, wherein the metal oxide comprises an aluminum oxide, a silicon oxide, or a combination thereof.

6. The luminescent nanostructure of claim 1, wherein
the luminescent nanostructure has a longitudinally extended shape, and
a diameter of the luminescent nanostructure is greater than or equal to about 50 nanometers and less than or equal to about 1000 nanometers.

7. The luminescent nanostructure of claim 1, wherein the aspect ratio is greater than or equal to about 3.

8. The luminescent nanostructure of claim 1, wherein the organic compound comprises one or more repeating units *-L-O—*, wherein L is a substituted or unsubstituted $C_1$ to 10 alkylene group,
* is a site bound to an adjacent atom in the organic compound.

9. The luminescent nanostructure of claim 1, wherein the organic compound comprises an organosilicon compound containing a Si—O—Si linkage.

10. The luminescent nanostructure of claim 1, wherein the organic compound comprises a carboxylate moiety, a phosphite moiety, a sulfonate moiety, an amine moiety, a carboxylic acid, an alkylene glycol moiety, or a combination thereof.

11. The luminescent nanostructure of claim 1, wherein the organic compound comprises a compound represented by Chemical Formula 1 or Chemical Formula 2:

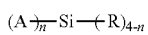

Chemical Formula 1

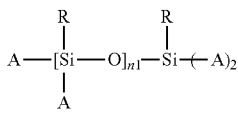

Chemical Formula 2 wherein n is an integer from 1 to 3,
n1 is an integer from 1 to 10,
group A of Chemical Formulae 1 or 2 is the same or different, and each independently a hydroxyl group, a substituted or unsubstituted C1 to C10 alkoxy group, chlorine, —O*, wherein * represents a portion connected to the surface of the luminescent nanostructure, or a combination thereof, provided that at least one A is —O*, and
group R of Chemical Formulae 1 or 2 is the same or different, and each independently a C1 to C40 substituted or unsubstituted aliphatic hydrocarbon group, a C6 to C40 substituted or unsubstituted aromatic hydrocarbon group, a C1 to C40 substituted or unsubstituted aliphatic hydrocarbon group in which at least one methylene is replaced by sulfonyl (—SO$_2$—), carbonyl (CO), ether (—O—), sulfide (—S—), sulfoxide (—SO—), ester (—C(═O)O—), amide (—C(═O)NR'—), wherein R' is hydrogen or a C1 to C10 alkyl group, a moiety represented by Chemical Formula 1-1, or a combination thereof;

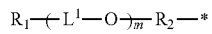

Chemical Formula 1-1 wherein, $R_1$ is hydrogen, a substituted or unsubstituted C1 to C30 alkyl ester moiety, a substituted or unsubstituted C1 to C10 alkoxy group, a hydroxy group, a carboxyl group, a (meth)acrylate group, an amine group, a maleimide group, a thiol group, or a C1 to C10 fluorinated alkoxy group,
$L^1$ is a substituted or unsubstituted C1 to C5 alkylene group or a substituted or unsubstituted C1 to C5 fluorinated alkyl group,
$R_2$ is a direct bond, a substituted or unsubstituted C1 to C20 alkylene group, sulfonyl (—SO$_2$—), carbonyl (CO), ether (—O—), sulfide (—S—), sulfoxide (—SO—), ester (—C(═O)O—), amide (—C(═O)NR—, wherein R is hydrogen or a C1 to C10 alkyl group), or a combination thereof,
* represents a portion connected to a Si atom of Chemical Formulae 1 or 2, and
m is 1 to 40.

12. The luminescent nanostructure of claim 1, wherein an amount of the organic compound in the luminescent nanostructure is greater than or equal to about 0.1 weight percent and less than or equal to about 10 weight percent, based on the total weight of the luminescent nanostructure.

13. The luminescent nanostructure of claim 1, wherein the luminescent nanostructure is configured to emit blue light, green light, or a combination thereof.

14. A light emitting device comprising the luminescent nanostructure of claim 1.

15. The light emitting device of claim 14, further comprising a conductor electrically connected to the semiconductor nanocrystal of the luminescent nanostructure.

16. A display device comprising the light emitting device of claim 14.

17. A method of producing the luminescent nanostructure of claim 1, comprising
preparing a substrate comprising a plurality of the luminescent nanostructures, and positioning the substrate into a deposition chamber; and
vapor depositing the organic compound on surfaces of the plurality of luminescent nanostructures in the deposition chamber.

18. The method of claim 17, wherein the plurality of the luminescent nanostructures are arranged on the substrate in such a manner that the luminescent nanostructures have one end bound to the surface of the substrate and extended in a direction away from the surface.

19. The method of claim 17, wherein the vapor depositing of the organic compound is conducted at a temperature of greater than or equal to about 100° C. and less than or equal to about 500° C.

20. A method of producing the luminescent nanostructure of claim 1, comprising:
providing a plurality of the luminescent nanostructures without the organic compound;
dispersing the luminescent nanostructures in an organic solvent including the organic compound to obtain a mixture; and
stirring the mixture at a temperature of greater than or equal to about 100° C.

* * * * *